United States Patent [19]

Fujie et al.

[11] 4,076,963
[45] Feb. 28, 1978

[54] PILOT SIGNAL CANCELLING CIRCUIT FOR FM MULTIPLEX DEMODULATOR

[75] Inventors: Seijiro Fujie, Tokyo, Japan; Susumu Yokoyama, deceased, late of Tokyo, Japan; by Toshikazu Yokoyama, administrator, Onomichi, Japan

[73] Assignee: Pioneer Electronic Corporation, Tokyo, Japan

[21] Appl. No.: 788,497

[22] Filed: Apr. 18, 1977

[30] Foreign Application Priority Data

Apr. 19, 1976 Japan .................................... 51-43636

[51] Int. Cl.² ............................................. H04H 5/00
[52] U.S. Cl. ................................. 179/15 BT; 325/436
[58] Field of Search ............. 179/15 BT; 325/36, 436, 325/467

[56] References Cited

U.S. PATENT DOCUMENTS 3,235,663  2/1966  Plus et al. ......................... 179/15 BT

*Primary Examiner*—Douglas W. Olms
*Attorney, Agent, or Firm*—Sughrue, Rothwell, Mion, Zinn and Macpeak

[57] ABSTRACT

A pilot signal cancelling circuit for an FM multiplex demodulator wherein the amplitude of the cancelling signal tracks that of the pilot signal contained in or mixed into the composite signal. The amplified composite signal is synchronously detected with the fixed amplitude 19 KHz pilot signal extracted by a phase lock loop 2, and the detector output is filtered to remove high frequency components and then converted to a current variation in a d.c. amplifier 13. The output of the latter is fed to a current controlled attenuator 14 together with the fixed amplitude pilot signal, and the level adjusted attenuator output is then inverted, divided into left and right channel components by the 38 KHz sub-carrier signals, and fed to adders in the multiplex demodulator outputs to cancel the pilot signal components therein.

12 Claims, 4 Drawing Figures

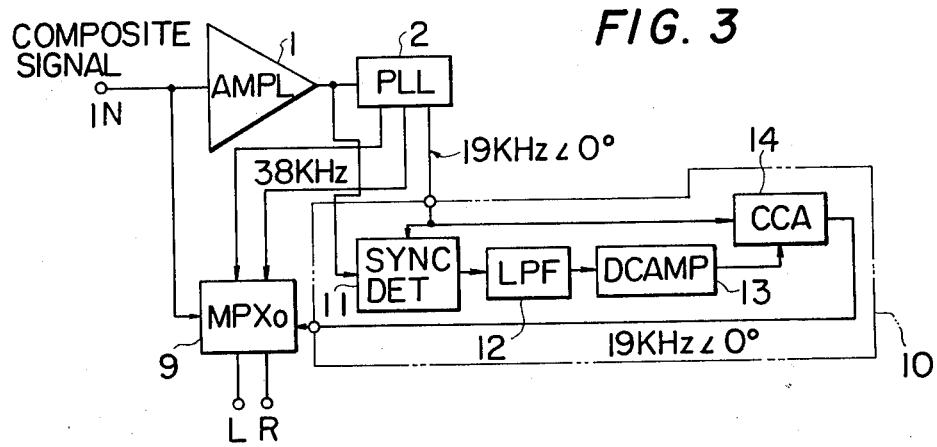

PILOT SIGNAL CANCELLING CIRCUIT FOR FM MULTIPLEX DEMODULATOR

BACKGROUND OF THE INVENTION

This invention relates to a pilot signal cancelling circuit for an MPX demodulator for cancelling pilot signal components contained in stereophonic signals obtained by dividing a composite signal.

In demodulating an FM signal in the pilot tone system, a pilot signal of 19 KHz is selectively detected from a composite FM signal, a sub-carrier signal of 38 KHz is obtained from the pilot signal, and right (R) and left (L) stereophonic signals are obtained from the composite signal by utilizing the sub-carrier signal as a switching signal. The composite signal also contains the pilot signal, however, whereby the latter becomes mixed into the right and left stereophonic signals through the switching operation of the sub-carrier signal.

As is indicated in FIG. 1, the pilot signal (a) is gated by the sub-carrier switching signals (b) and (c) into signals having waveforms (d) and (e), which are mixed into the right and left stereophonic signals. As the signal components (d) and (e) would otherwise lower the S/N ratio of the normally demodulated right and left stereophonic signals, they are typically eliminated by using a trap or a low pass filter. This method is disadvantageous, however, in that it may lower the fidelity characteristics of the normally demodulated stereophonic signals.

In order to overcome this difficulty, a pilot signal cancelling circuit generally indicated by reference numeral $9_2$ in FIG. 2 has been proposed, as described in Japanese Patent Application No. 106393/1975. Signals of 38 KHz and 19 KHz whose phases are in synchronization with the phase of the 19 KHz pilot signal (FIG. 1(a)) in the composite signal are obtained by a phase lock loop (PLL) 2. With the aid of the 38 KHz signals, the composite signal is synchronously detected by a multiplexer MPXR 3 wherein the composite signal is divided into right and left stereophonic signals each containing the pilot signal. At the same time, the zero phase angle pilot signal (19 KHz $\angle$ 0°) from the PLL 2 is inverted by a phase inverting circuit 6, and the inverted signal (FIG. 1 (f)) is divided into right and left signal components (FIG. 1 (g) and (h)) by switching circuits 7 and 8 in response to the 38 KHz signals. These signal components are then added to the right and left stereophonic signals from the MPXR 3 by adders 4 and 5, wherein they cancel the pilot signal components (d) and (e).

Such a pilot signal cancelling circuit is not completely effective, however, in cases where the level of the pilot signal contained in the composite signal varies or fluctuates, since the level of the pilot signal cancelling components obtained from the PLL 2 is fixed in magnitude. Thus, if the level of the pilot signal contained in the composite signal varies in response to radio wave propagation conditions or between different broadcasting stations selected, the cancelling operation effected by the adders is sometimes incomplete.

SUMMARY OF THE INVENTION

Accordingly, an object of this invention is to eliminate all of the above-described drawbacks, and more specifically to provide a pilot signal cancelling circuit wherein the level of the pilot signal cancelling components is varied according to the level of the pilot signal contained in the composite signal, whereby the cancelling operation is more complete and is not affected by varying external conditions.

BRIEF DESCRIPTION OF THE DRAWINGS

In the drawings:

FIG. 3 shows a block diagram of an MPX demodulating and pilot signal cancelling circuit according to this invention, and FIG. 4 shows a schematic circuit diagram of the d.c. amplifier and current control attenuator included in FIG. 3.

DETAILED DESCRIPTION OF THE PREFERRED EMBODIMENT

Figure 1:
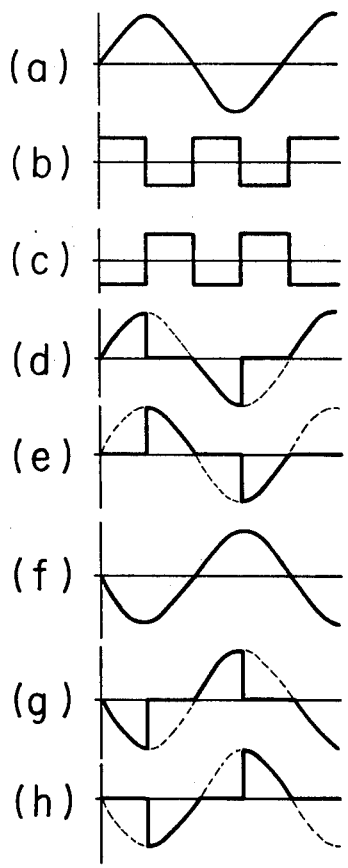
FIGS. 1 (a) – (h) show various waveform diagrams for describing the operation of a pilot signal cancelling system.

An embodiment of this invention will now be described with reference to FIGS. 3 and 4, in which the components corresponding to those shown in FIG. 2 have been designated by the same reference numerals.

Figure 2:
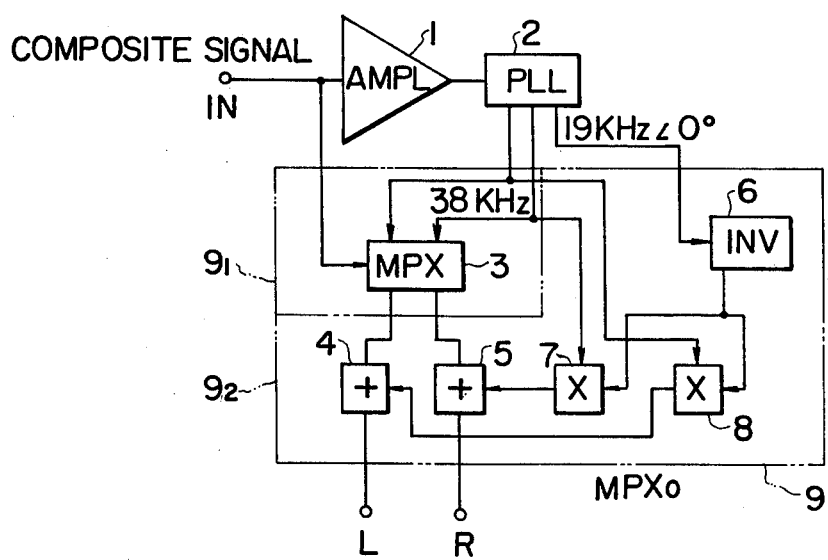
FIG. 2 shows a block diagram of an MPX demodulating system including a conventional pilot signal cancelling circuit.

Reference numeral 9 designates a multiplexer MPXo including the MPX $9_1$ and the pilot signal cancelling circuit $9_2$ shown in FIG. 2, and reference numeral 10 designates a level compensating circuit according to this invention. A synchronous detector 11 therein subjects the pilot signal (FIG. 1 (a)) contained in the composite signal to AM detection with the aid of the 19 KHz $\angle$ 0° pilot signal from the PLL 2, to thereby obtain a signal synchronized with the pilot signal. A low pass filter 12 removes the high frequency components from the detected signal, and feeds it to a d.c. amplifier 13 whose output in turn is supplied to a current controlled attenuator 14 for controlling the level of the pilot signal cancelling signal from the PLL 2.

The level controlled output of the attenuator 14 is applied to the MPXo 9, more specifically to the phase inverting circuit (INV) 6 therein as shown in FIG. 2. Accordingly, the pilot signal components mixed with the right and left stereophonic signals are more completely cancelled in the adders 4 and 5.

Although the concept of the invention is equally applicable to sinusoidal signal processing, in actual practice the 19 KHz pilot signal output from the PLL 2 is a square wave taken from the output of a flip-flop circuit. Such a signal, even when level adjusted in accordance with the magnitude of the pilot signal, will not effect complete or 100% cancellation since the pilot signal components remaining in the stereo output signals are chopped sinusoids, as in FIGS. 1 (d) and (e). The remaining or uncancelled signal portions have a relatively high frequency, however, and can easily be removed by simple channel output filters without degrading the audio fidelity. Moreover, with such a square wave cancelling signal the inverter 6 can be eliminated by simply reversing the flip-flop output wires.

Thus, the synchronous detector 11 functions as a gate circuit for the amplified composite signal, in response to the 19 KHz square wave from the PLL 2, producing a 19 KHz half-cycle ripple signal at its output, i.e. the positive half-cycles of the sinusoidal pilot signal. The remaining portions of the composite signal, i.e. the 0–15

KHz L + R component and the 23 - 53 KHz L − R component, can easily be removed by a simple band pass filter integral with the amplifier 1 or the synchronous detector 11. The low pass filter 12 performs an integrating function to convert the ripple signal into a d.c. signal whose amplitude varies in proportion to that of the pilot signal.

The d.c. amplifier circuit 13 and the current controlled attenuator 14 are shown in greater detail in FIG. 4, wherein transistors $Q_1$ through $Q_3$ form a differential amplifier for amplifying the output signal from the low pass filter 12, while transistors $Q_5$ through $Q_7$ form a current mirror circuit. A transistor $Q_4$ serves as a current drain, transistors $Q_8$, $Q_9$, $Q_{12}$ and $Q_{13}$ form another mirror circuit, and transistors $Q_{14}$ through $Q_{16}$ form a third current mirror circuit. Transistors $Q_{10}$ and $Q_{11}$ comprise a switching circuit responsive to the pilot signal of 19 KHz ∠ 0° from the PLL 2.

The emitter resistor of transistor $Q_4$ has a value twice as high as that of transistor $Q_3$, and similarly the emitter resistor of transistor $Q_{13}$ is twice as high as that of transistors $Q_8$ and $Q_{12}$. A resistor $R_3$ and a d.c. source E constitute the load resistor and an output terminal biasing source, respectively.

When the output signal from the low pass filter 12 is zero, the collector currents of transistors $Q_1$ and $Q_2$ are equal to each other. As a result, the same current flows in transistor $Q_7$ due to the action of the current mirror circuit. All of the current of transistor $Q_7$ is drawn by transistor $Q_4$ because its emitter resistance is twice that of transistor $Q_3$. Thus, when no pilot signal exists, no signal from the d.c. amplifier circuit 13 is delivered to the current control attenuator.

When a signal from the low pass filter 12 is applied to the differential amplifier comprising transistors $Q_1$ through $Q_3$, the collector current of transistor $Q_1$ becomes different from that of transistor $Q_2$, and a difference current corresponding to the level of the pilot signal flows in the collector of transistor $Q_5$. As a result, an equivalent current flows in transistor $Q_7$ due to the current mirror circuit, and part of this collector current flows through transistor $Q_8$. This in turn, by current mirrow action, causes currents to flow in transistors $Q_{12}$ and $Q_{13}$ in a ratio of 2:1, respectively.

The switching circuit made up of transistors $Q_{10}$ and $Q_{11}$ operates in response to the pilot signal supplied by the PLL 2, and a current corresponding to the pilot signal flows in the collector of transistor $Q_{14}$. A current of equal value flows through transistor $Q_{16}$ due to the current mirror connection. However, transistor $Q_{13}$, as described above, acts as a current drain under the control of a signal corresponding to the pilot signal from the low pass filter 12. As a result, the magnitude of the pilot signal output current of 19 KHz ∠ 0° is controlled by the pilot signal included in the composite signal. More specifically, an output signal is delivered which varies at a repetitive period of 19 KHz and which has a current amplitude between zero and a value twice as high as that of the current drawn off by transistor $Q_{13}$. Thus, a pilot signal cancelling signal is provided at the output terminal without varying the d.c. potential established by the load resistor $R_3$ and the biasing source E.

Stated another way, when the L.P.F. 12 output is zero the plus and minus outputs therefrom are balanced whereby transistors $Q_1$, $Q_2$, $Q_5$ and $Q_7$ all conduct equally. At the same time, transistors $Q_3$ and $Q_4$ must always conduct in a 2:1 ratio since their bases are commonly biased and their emitter resistors are in a 1:2 ratio. Thus, since all of the current from transistors $Q_1$ and $Q_2$ (2X) is drained through $Q_3$, then all of the current from transistor $Q_7$ (X) must be drained or flow through $Q_4$, which leaves transistors $Q_8$ and $Q_9$ non-conductive. When the outputs from L.P.F. 12 are unbalanced, however, transistors $Q_2$, $Q_5$ and $Q_7$ conduct more heavily than $Q_1$, and the additional current through $Q_7$ (in excess of X) is drained through $Q_8$ to thus deliver an output to the attenuator 14 (functionally corresponding to the $+B_2$ input of the d.c. amplifier 13). A similar operational analogy applies to the current controlled attenuator 14, wherein transistors $Q_8$ and $Q_9$ are replaced by load resistor $R_3$ and biasing source E.

Since, according to this invention, current control is employed instead of voltage control, as in a conventional AGC circuit, no d.c. drift phenomenon or problem occurs and it it thus unnecessary to provide a d.c. blocking capacitor.

What is claimed is:

1. In a pilot signal cancelling circuit for an FM multiplex demodulator, including a composite signal source, a phase lock loop for deriving a fixed amplitude 19 KHz pilot signal and 38 KHz sub-carrier switching signals from the composite signal, a multiplex demodulator for deriving right and left channel stereophonic output signals from the composite signal in response to the switching signals, said output signals containing pilot signal components, circuit means for generating pilot signal cancelling signals from the fixed amplitude pilot signal, and circuit means for combining the cancelling signals with the demodulator output signals to cancel said pilot signal components therein, the improvements characterized by:
   a. synchronous detector means for producing a pulsating signal from the composite signal in response to the fixed amplitude pilot signal, said pulsating signal having an amplitude proportional to the amplitude of the pilot signal contained in the composite signal,
   b. filter circuit means for converting the pulsating signal into a variable voltage d.c. signal,
   c. circuit means for converting the filter circuit means output from a variable voltage signal to a variable current signal,
   d. current controlled attenuator means for varying the magnitude of the fixed amplitude pilot signal in response to the converting circuit means output, and
   e. means coupling the attenuator means output to the generating circuit means.

2. A pilot signal cancelling circuit as defined in claim 1, wherein the converting circuit means comprises a d.c. amplifier.

3. A pilot signal cancelling circuit as defined in claim 1, wherein the filter circuit means comprises an integrating filter.

4. A pilot signal cancelling circuit as defined in claim 2, wherein the filter circuit means comprises an integrating filter.

5. A pilot signal cancelling circuit as defined in claim 1, wherein the fixed amplitude pilot signal is a square wave, and the synchronous detector means functions as a half-cycle gate.

6. A pilot signal cancelling circuit as defined in claim 2, wherein the fixed amplitude pilot signal is a square wave, and the synchronous detector means functions as a half-cycle gate.

7. A pilot signal cancelling circuit as defined in claim 3, wherein the fixed amplitude pilot signal is a square wave, and the synchronous detector means functions as a half-cycle gate.

8. A pilot signal cancelling circuit as defined in claim 4, wherein the fixed amplitude pilot signal is a square wave, and the synchronous detector means functions as a half-cycle gate.

9. A pilot signal cancelling circuit as defined in claim 2, wherein the d.c. amplifier and the current controlled attenuator means each comprise a ratio balanced output current drain circuit, and an output current overflow circuit coupled to the drain circuit.

10. A pilot signal cancelling circuit as defined in claim 4, wherein the d.c. amplifier and the current controlled attenuator means each comprise a ratio balanced output current drain circuit, and an output current overflow circuit coupled to the drain circuit.

11. A pilot signal cancelling circuit as defined in claim 6, wherein the d.c. amplifier and the current controlled attenuator means each comprise a ratio balanced output current drain circuit, and an output current overflow circuit coupled to the drain circuit.

12. A pilot signal cancelling circuit as defined in claim 8, wherein the d.c. amplifier and the current controlled attenuator means each comprise a ratio balanced output current drain circuit, and an output current overflow circuit coupled to the drain circuit.

* * * * *